United States Patent
Farshchian et al.

(10) Patent No.: US 11,324,146 B2
(45) Date of Patent: May 3, 2022

(54) MODULAR DATA CENTER SERVERHALL ASSEMBLY

(71) Applicant: Google LLC, Mountain View, CA (US)

(72) Inventors: Soheil Farshchian, San Jose, CA (US); Angela Ying-Ju Chen, San Francisco, CA (US); Winnie Leung, Palo Alto, CA (US); Pascal C. Kam, Union City, CA (US); Kenneth Dale Shaul, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/919,270

(22) Filed: Jul. 2, 2020

(65) Prior Publication Data

US 2022/0007547 A1 Jan. 6, 2022

(51) Int. Cl.
*H05K 7/20* (2006.01)
*H05K 7/14* (2006.01)

(52) U.S. Cl.
CPC ....... *H05K 7/20736* (2013.01); *H05K 7/1492* (2013.01)

(58) Field of Classification Search
CPC .. H05K 7/1497; H05K 7/2079; H05K 7/1489; H05K 7/20772; H05K 7/20709; H05K 7/1488; H05K 7/20809; H05K 7/20827; H05K 7/1491; H05K 7/1485; H05K 7/18; H05K 5/0204; H05K 5/0247; H05K 5/0217; H05K 7/14; H05K 9/0062; H05K 7/20736; H05K 7/1492; E04H 2005/005
See application file for complete search history.

(56) References Cited

U.S. PATENT DOCUMENTS

| | | | |
|---|---|---|---|
| 5,969,292 A * | 10/1999 | Snider, Jr. | H02G 3/0443 174/498 |
| 8,456,840 B1 | 6/2013 | Clidaras et al. | |
| 8,713,869 B1 * | 5/2014 | Eychaner | H05K 7/20745 52/241 |

(Continued)

FOREIGN PATENT DOCUMENTS

| EP | 2392201 B1 | 3/2016 |
|---|---|---|
| EP | 3163993 A1 | 5/2017 |

OTHER PUBLICATIONS

Extended European Search Report for European Patent Application No. 20208970.2 dated May 4, 2021. 10 pages.

*Primary Examiner* — Michael A Matey
(74) *Attorney, Agent, or Firm* — Lerner, David, Littenberg, Krumholz & Mentlik, LLP

(57) ABSTRACT

A kit for forming a data center comprising a first rack, a second rack, a first support having a first end and a second end opposite the first end, the first support configured to be secured to the floor at the first end, a cooling frame having a cooling unit received therein, the cooling frame having a first face and a second face opposite the first face, the cooling frame configured to be secured to the second end of the first support, a first distribution frame having a first plurality of support arms extending therefrom, the first distribution frame configured to be coupled to the first face of the cooling frame, and a second distribution frame having a second plurality of support arms extending therefrom, the second distribution frame configured to be coupled to the second face of the cooling frame.

20 Claims, 11 Drawing Sheets

(56) References Cited

U.S. PATENT DOCUMENTS

| | | | |
|---|---|---|---|
| 9,145,677 B2* | 9/2015 | Wang | E04B 9/06 |
| 9,537,291 B1* | 1/2017 | Wilding | H05K 7/20836 |
| 9,622,389 B1* | 4/2017 | Roy | H05K 7/20745 |
| 9,823,715 B1* | 11/2017 | Roy | H05K 7/20745 |
| 10,492,326 B2 | 11/2019 | Latino et al. | |
| 2010/0051563 A1 | 3/2010 | Schreiber | |
| 2010/0144265 A1* | 6/2010 | Bednarcik | H05K 7/20745 |
| | | | 454/184 |
| 2010/0188816 A1* | 7/2010 | Bean, Jr. | H05K 7/20745 |
| | | | 361/696 |
| 2010/0300648 A1* | 12/2010 | Grantham | H05K 7/20745 |
| | | | 165/55 |
| 2010/0307716 A1* | 12/2010 | Bean, Jr. | H05K 7/20827 |
| | | | 165/80.2 |
| 2011/0271610 A1* | 11/2011 | Cottuli | H05K 7/20745 |
| | | | 52/173.1 |
| 2012/0181906 A1* | 7/2012 | Caveney | H05K 7/20745 |
| | | | 312/237 |
| 2012/0300391 A1* | 11/2012 | Keisling | H05K 7/20781 |
| | | | 361/679.46 |
| 2013/0276389 A1* | 10/2013 | Marrs | E04B 2/74 |
| | | | 52/173.1 |
| 2014/0216780 A1* | 8/2014 | Yanniello | H02G 5/005 |
| | | | 174/95 |
| 2014/0285965 A1* | 9/2014 | Keisling | H05K 7/20609 |
| | | | 361/679.53 |
| 2014/0321050 A1* | 10/2014 | Sato | G06F 1/20 |
| | | | 361/679.47 |
| 2015/0098177 A1* | 4/2015 | Wilcox | E04B 1/34869 |
| | | | 361/679.31 |
| 2015/0259938 A1* | 9/2015 | Bernard | A47B 87/008 |
| | | | 52/64 |
| 2015/0342094 A1* | 11/2015 | Ross | H05K 7/20145 |
| | | | 361/679.46 |
| 2016/0324036 A1* | 11/2016 | Slessman | H05K 7/202 |
| 2017/0121966 A1* | 5/2017 | Jiang | F24F 13/12 |
| 2017/0127569 A1* | 5/2017 | Rimler | F24F 13/0227 |
| 2017/0231111 A1* | 8/2017 | Malone | H05K 7/20145 |
| 2018/0027701 A1 | 1/2018 | Kam et al. | |
| 2018/0132385 A1* | 5/2018 | Gosselin | H05K 7/20745 |

\* cited by examiner

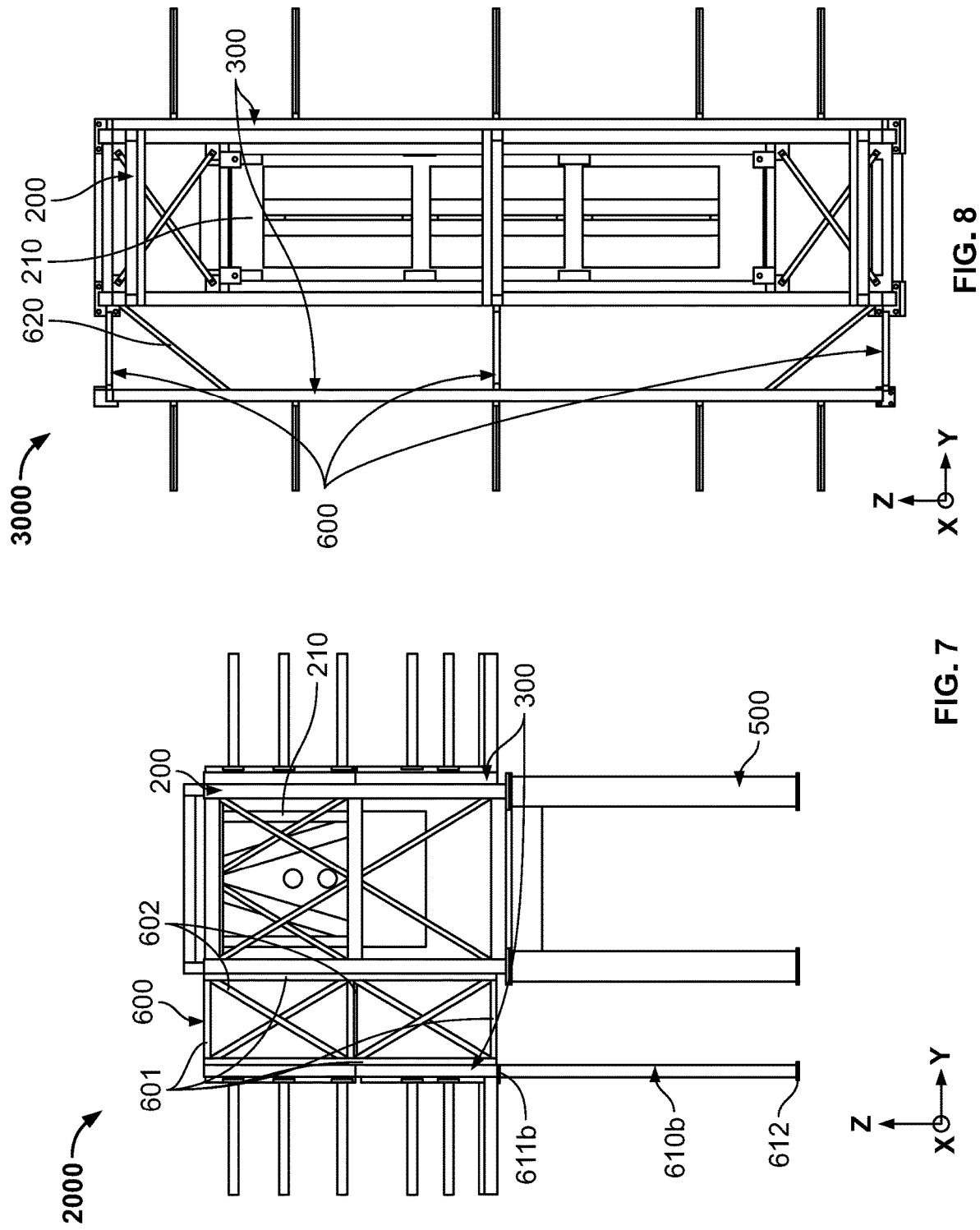

MODULAR DATA CENTER SERVERHALL ASSEMBLY

BACKGROUND

Constructing new data centers can be resource intensive and require significant amounts of advance planning. For example, constructing server rooms can be challenging due to the number of issues that must be considered, such as thermal zone management and optimizing the space of a given data center site. Current practices of constructing server rooms involve constructing monolithic or semi-modular assemblies. Monolithic assemblies are floor to roof structures that require the entire assembly be built prior to installing and employing server racks, leading to an increase in the time and complexity of constructing a new data center. Moreover, such monolithic assemblies make it difficult to maintain portions of the data center without dismantling or moving other, unrelated portions of the data center.

Semi-modular assemblies allow for certain portions of the assembly to be modularized such that changing one component of the assembly will not necessarily require dismantling or moving another component of the assembly. However, current semi-modular assemblies are still floor to roof structures that prevent further modularization without adversely affecting the performance of the data center. For instance, such assemblies require a ceiling grid to act as an interface between the hot plenum and the lower aisle containment of the server room. As many data center sites do not have uniform roof structures and heights, in order to maintain a certain level of data center performance, semi-modular assemblies still require that assembly components be customized for the construction of each data center.

BRIEF SUMMARY

In accordance with an aspect of the disclosure, a kit comprises a first rack, a second rack, a first support having a first end and a second end opposite the first end, the first support configured to be secured to the floor at the first end, a cooling frame having a cooling unit received therein, the cooling frame having a first face and a second face opposite the first face, the cooling frame configured to be secured to the second end of the first support, a first distribution frame having a first plurality of support arms extending therefrom, the first distribution frame configured to be coupled to the first face of the cooling frame, and a second distribution frame having a second plurality of support arms extending therefrom, the second distribution frame configured to be coupled to the second face of the cooling frame. The first distribution frame may include a first bus plug and the second distribution frame includes a second bus plug. The cooling unit may be at least one of a fan, cooling distribution unit, or liquid cooler. The kit may further comprise an intermediate frame, the cooling frame having a third face transverse to the first face and the second face, the intermediate frame configured to be secured to the third face of the cooling frame. The kit may further comprise an extension frame having a first end and a second end opposite the first end, the first end of the extension frame configured to be secured to the first face of the cooling frame and the second end of the extension frame configured to be secured to the first distribution frame. The kit may further comprise a support leg configured to support a first end of the first distribution frame. The kit may further comprise a first rack and a second rack.

In accordance with another aspect of the disclosure, a method of operating a data center comprises installing a first end of a first support to a floor, the first support having a second end opposite the first end, securing a cooling frame to the second end of the first support, the cooling frame including a cooling unit, coupling a first distribution frame to a first face of the cooling frame, the cooling frame having a second face opposite the first face, coupling a second distribution frame to the second face of the cooling frame, forming a hot air corridor by positioning a first rack adjacent a first side of the first support and positioning a second rack adjacent a second side of the first support opposite the second side of the first support, and receiving hot air from the hot air corridor within the cooling unit and expelling a cool medium through at least one of the first face or the second face of the coupling frame. The method may further comprise securing a first bus plug and a first transfer switch to the first distribution frame, and a second bus plug and a second transfer switch facing to the second distribution frame. The method may further comprise supporting a first bus duct with a first plurality of support arms extending from the first distribution frame, and supporting a second bus duct with a second plurality of support arms extending from the second distribution frame. The method may further comprise positioning the first rack between the first plurality of arms and the floor, and positioning the second rack between the second plurality of arms and the floor. The method may further comprise securing a first end of an extension frame to the first face of the cooling frame and a second end of the extension frame opposite the first end of the extension frame to the first distribution frame. The method may further comprise securing a support leg to a first end of the first distribution frame. The first support may be secured to a first end of the cooling frame, and the method further comprises securing a second support to a second end of the cooling frame. The method may further comprise securing an intermediate frame to a third face of the cooling frame, the third face being transverse to the first face and the second face.

In accordance with yet another aspect of the disclosure, a data center system comprising a first rack and a second rack defining a hot air corridor therebetween, a first support having a first end and a second end opposite the first end, the first end of the first support secured to a floor within the hot air corridor, a cooling frame secured to the second end of the first support, the cooling frame having a first face and a second face opposite the first face, a cooling unit secured within the cooling frame, the cooling unit configured to receive hot air from the hot air corridor and expel a cool medium through at least one of the first face or the second face of the cooling frame, a first distribution frame coupled to the first face of the cooling frame, and a second distribution frame coupled to the second face of the cooling frame. The first distribution frame may include a first bus plug and a first transfer switch, and the second distribution frame includes a second bus plug and a second transfer switch. The first distribution frame may include a first plurality of support arms supporting a first bus duct, and the second distribution frame may include a second plurality of support arms supporting a second bus duct. The first distribution frame may include a third bus plug, the first bus plug having a greater height from the floor than the third bus plug, and the first bus plug and third bus plug having a greater height from the floor than the first transfer switch, and the second distribution frame may include a fourth bus plug, the second bus plug having a greater height from the floor than the fourth bus plug, and the second bus plug and the fourth bus plug having a greater height from the floor than the second transfer switch. The first distribution frame may include a first transport tray supported by the first plurality of arms, the first transport tray having a height from the floor less than the first transfer switch, the second distribution framed may include a second transport tray supported by the second plurality of arms, the second transport tray having a height from the floor less than the second transfer switch. The first rack may be positioned between the first plurality of support arms of the first distribution rack and the floor, and the second rack may be positioned between the second plurality of support arms of the second distribution rack and the floor. The data center may further comprise an extension frame having a first end and a second end opposite the first end, the first end of the extension secured to the first face of the cooling frame and a second end of the extension frame secured to the first distribution frame. The data center may further comprise a support leg supporting a first end of the first distribution frame. The cooling unit may be at least one of a fan, cooling distribution unit, or liquid cooler. The data center may further comprise a second support, the first support secured to a first end of the cooling frame and the second support secured to a second end of the cooling frame. The data center may further comprise an intermediate frame, the cooling frame having a third face transverse to the first face and the second face, the intermediate frame secured to the third face of the cooling frame.

In accordance with yet another aspect of the disclosure, a kit for using a data center comprises a cooling module having a cooling unit received therein, the cooling module having a first face and a second face opposite the first face, a first distribution module having a first plurality of support arms extending therefrom, first plurality of support arms supporting a first bus duct, the first distribution module configured to be coupled to the first face of the cooling module, and a second distribution module having a second plurality of support arms extending therefrom, the second plurality of support arms supporting a second bus duct, the second distribution module configured to be coupled to the second face of the cooling module. The first distribution module may include a first bus plug and a first transfer switch, and the second distribution module includes a second bus plug and a second transfer switch. The kit may further comprise an extension frame having a first end and a second end opposite the first end, the first end of the extension frame configured to be secured to the first face of the cooling module and the second end of the extension frame configured to be secured to the first distribution module. The kit may further comprise a support leg configured to support a first end of the first distribution module. The kit may further comprise a first rack and a second rack. The kit may further comprise an intermediate frame, the cooling module having a third face transverse to the first face and the second face, the intermediate frame configured to be secured to the third face of the cooling module.

BRIEF DESCRIPTION OF THE DRAWINGS

FIG. 7 is a front view of the assembly of FIG. 6.

FIG. 8 is a front view of an assembly in accordance with aspects of the disclosure.

DETAILED DESCRIPTION

This technology is directed to a modularized assembly, such as for server halls of a data center, enabling certain components of the assembly to be engaged and disengaged from the assembly without affecting other components of the assembly, as desired. Moreover, these portions of the assembly can come together as a kit ready to be installed and allow for increased efficiency in the construction of new data centers.

Figure 1:
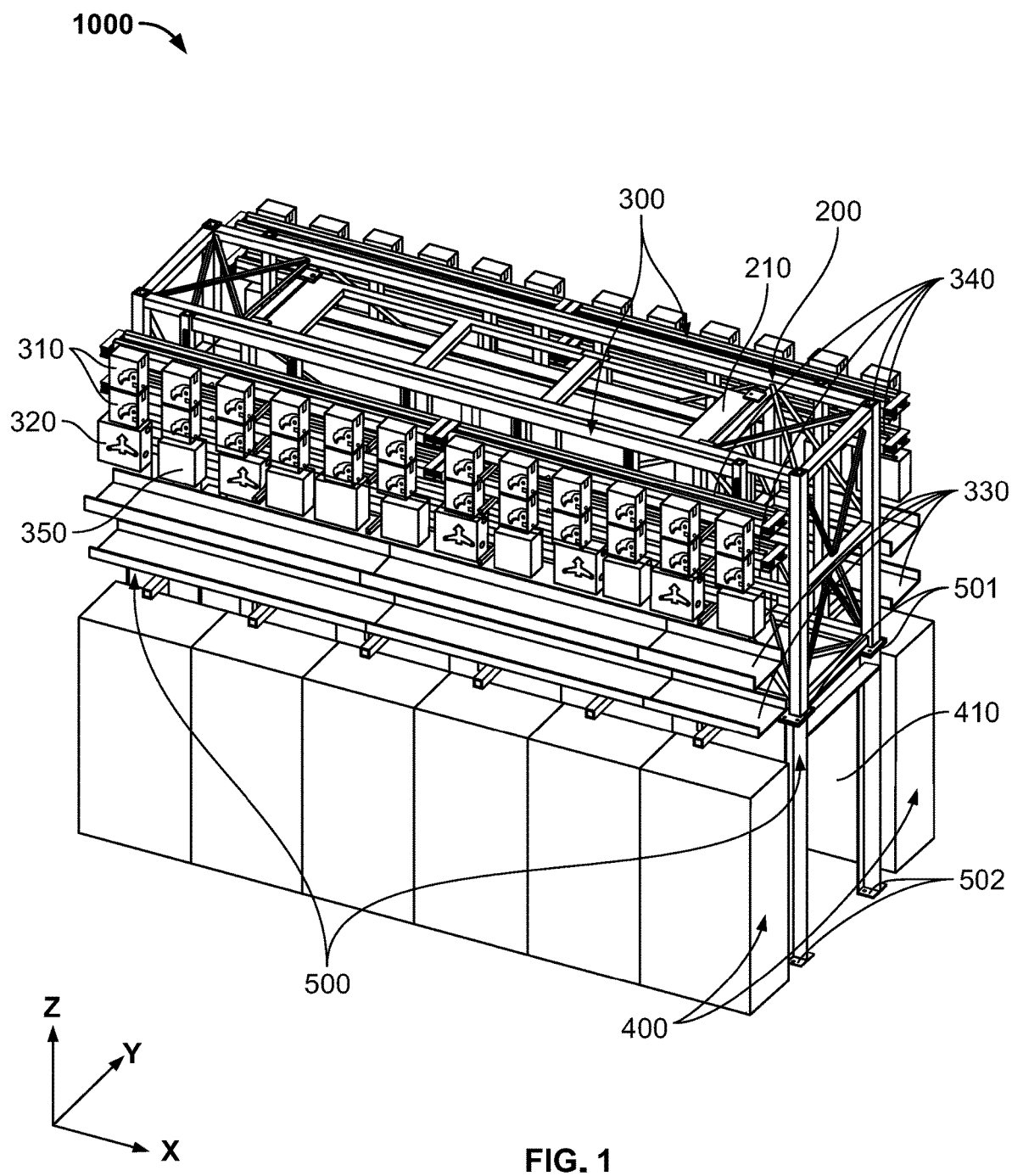
FIG. 1 is an isometric view of an assembly in accordance with aspects of the disclosure.

FIG. 1 depicts assembly 1000 having cooling frame 200, distribution frame 300, server racks 400, and supports 500. Server racks 400 are substantially rectangular however, in other examples, the server racks can have any other geometric shape, such as cylindrical, cuboid, spherical, or the like. Server racks 400 can house various electrical components for use in a data center, such as a number of computing servers, memory components, or the like. Server racks 400 can be configured to direct hot air generated from the electrical components toward a hot air corridor 410 along the Y-direction defined between the server racks. Hot air corridor 410 can be configured to receive the hot air from the electrical components housed in server racks 400.

Supports 500 are secured at each end of assembly 1000 to the floor through bottom end 502. Cooling frame (or module) 200 is secured to a top end 501 of support 500 and houses a cooling unit 210 therein. Cooling unit 210 can be configured to receive the hot air rising from hot air corridor 410 and to expel a cool medium, such as cold air, from the faces of the cooling frame facing the Y-direction such that the cold air falls down onto server racks 400 to cool down the electrical components within the server racks. Support 500 are received within hot air corridor 410 to decrease the total width of assembly 1000 along the Y-direction as well as to more efficiently concentrate the hot air to rise into cooling unit 210.

Distribution frames (or modules) 300 are secured to opposing faces of the cooling frame 200 facing along the Y-direction and above server racks 400. Distribution frames 300 can be placed above server racks 400 as the components of the server racks can require more maintenance than the accessories of the distribution frames. In this manner, server racks 400 is placed in a position that is more accessible than distribution frames 300. Distribution frames 300 includes a number of accessories, such as bus plugs 310, transfer switches 320, cable trays 330, bus ducts 340, distribution units 350, as further discussed below. The accessories can be facing along a Y-direction to enable distribution frame 300 to be more easily installed onto cooling frame 200. The accessories will be described in more detail below.

Assembly 1000 can be assembled from a kit of parts including cooling frame 200 with or without cooling unit 210 already installed to the cooling frame, distribution frame 300 with or without any of the accessories, server rack 400, and struts 500. In this manner, assembly 1000 is modularized such that each component of the assembly can arrive in the kit ready for installation as well as being able to be removed and installed for maintenance without affecting other components of the assembly.

Figure 2:
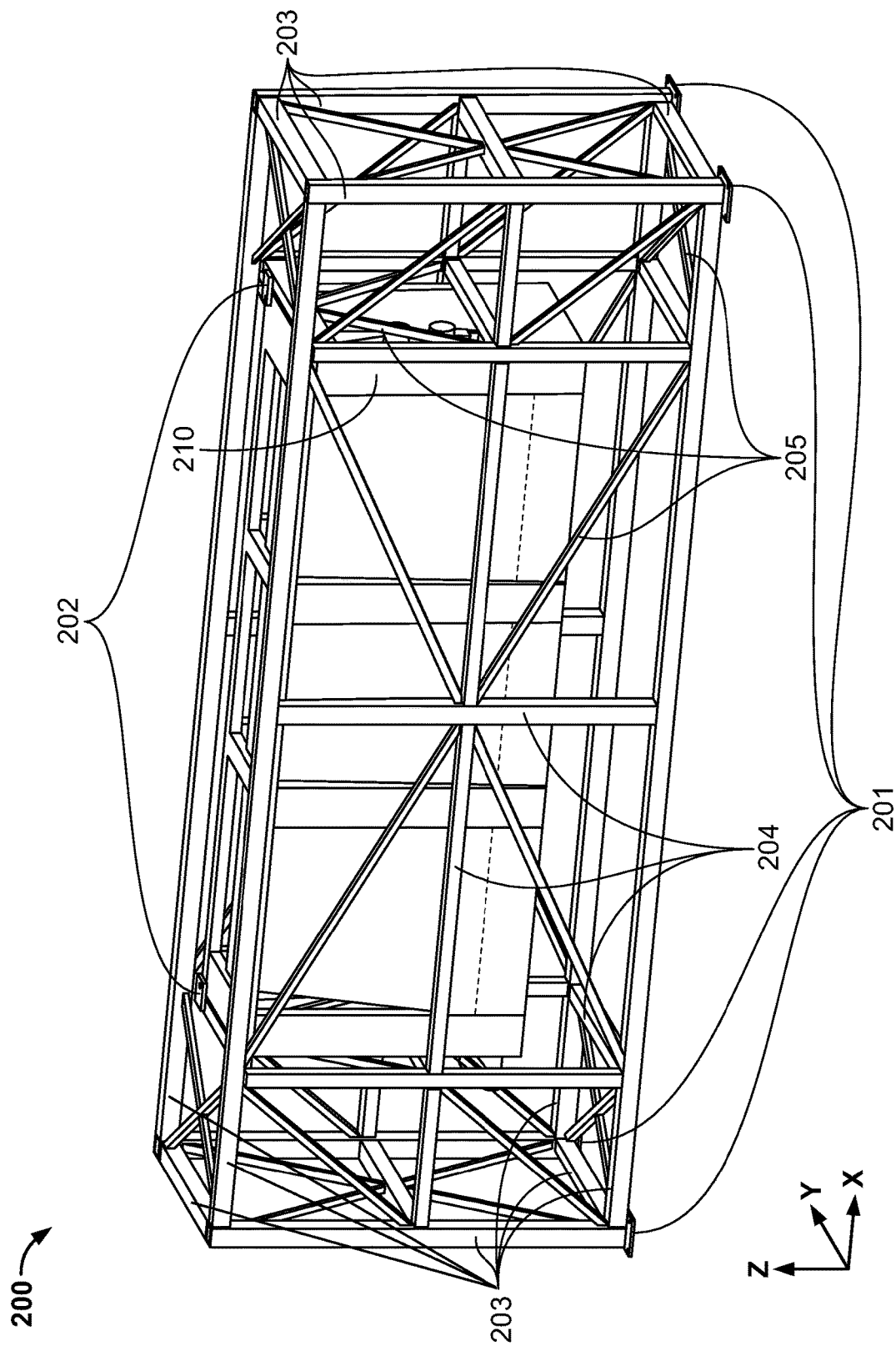
FIG. 2 is an isometric view of a cooling frame in accordance with aspects of the disclosure.

FIG. 2 depicts cooling frame 200 housing a cooling unit 210 therein. Cooling unit 210 can be any means of providing cool air such as a fan, cooling distribution unit, liquid cooler, or any other means of cooling hot air from hot air corridor 410. Further, cooling unit 210 can be configured to receive hot air along a Z-direction from hot air corridor 410 and expel a cool medium (such as air) from one of faces of cooling frame 200, such as the faces of the cooling frame facing along the Y-direction. Alternatively, the cool medium can be a cool liquid expelled along a pipe coupled to the cooling unit.

Cooling frame 200 comprises a number of main struts 203, a number of orthogonal struts 204, and a number of diagonal support struts 205. Main struts 203 can define the shape of cooling frame 200 while orthogonal struts 204 and diagonal struts 205 can provide structural support to the cooling frame. As main struts 203 define a substantially rectangular frame cooling frame 200, the main struts therefore define six faces of the cooling frame facing along one of an X-, Y-, or Z-direction and defining a number of openings. In another example, main struts 203 can define a different geometrical shape for cooling frame 200 with a corresponding number of faces. For instance, main struts 203 can define a pyramidal cooling frame 200 with four faces or any other shape.

Orthogonal struts 204 are connected along a length of main struts 203 and extend substantially along an X-, Y-, or Z-direction. Diagonal struts 205 extend from a corner defined between a pair of orthogonal struts 204 along a direction toward an opposite corner defined by an opposite pair of horizontal and vertical struts.

The number of intervening struts 204, 205 provided for each face of cooling frame 200 can depend on the area of each face of the cooling frame; the larger the area of each face of the cooling frame, the greater number of intervening struts are required to provide sufficient support. For instance, the faces of cooling frame 200 facing the Y-direction has a larger area than the faces of the cooling frame facing the X- or Z-directions, while the area of the faces of the cooling frame facing the Z-direction is larger than the area of the cooling frame facing the X-direction. As such, the faces of cooling frame 200 facing the Y-direction each have seven orthogonal struts 204 and eight diagonal struts 205 while the faces of cooling frame 200 facing the Z-direction each have two orthogonal struts and six diagonal struts, and the face of cooling frame 200 facing the X-direction each have one orthogonal strut and four diagonal struts. In another example, there can be more or less intervening struts 204, 205 on each face of cooling frame 200, such as only three orthogonal struts 205 and four diagonal struts 205 on each face of the cooling frame facing the Y-direction.

Struts 203, 204, 205 may be substantially rectangular and hollow. In this manner, struts 203, 204, 205 can provide structural support to cooling frame 200 while minimizing the weight of the cooling frame. In another example, struts 203, 204, 205 can be cylindrical, triangular, or any other geometric shape. In yet another example, struts 203, 204, 205 are not hollow.

Plates 201 are substantially rectangular and are secured to bottom ends of main struts 203. Plates 201 can be configured to engage with a top end 501 of supports 500 through fasteners, rivets, screws, or the like. Plate 201 enables cooling frame 200 to be modularized as the cooling frame can be disengaged from assembly 1000 by disengaging plate 201 from support 500 without affecting other components of assembly 1000, such as distribution frames 300, server racks 400, or supports 500.

Plates 202 are substantially rectangular and are secured to orthogonal struts 204 along a face of cooling frame 200 facing along the Z-direction. Plates 202 can secure cooling unit 210 to cooling frame 200 through fasteners, rivets, screws, or the like. In another example, plates 201, 202 can have any geometrical shape, such as circular, triangular, or the like. Struts 203, 204, 205 and plates 201, 202 can be secured to each through fasteners, rivets, welding, metal stitching, or any other means of securement.

Figure 3:
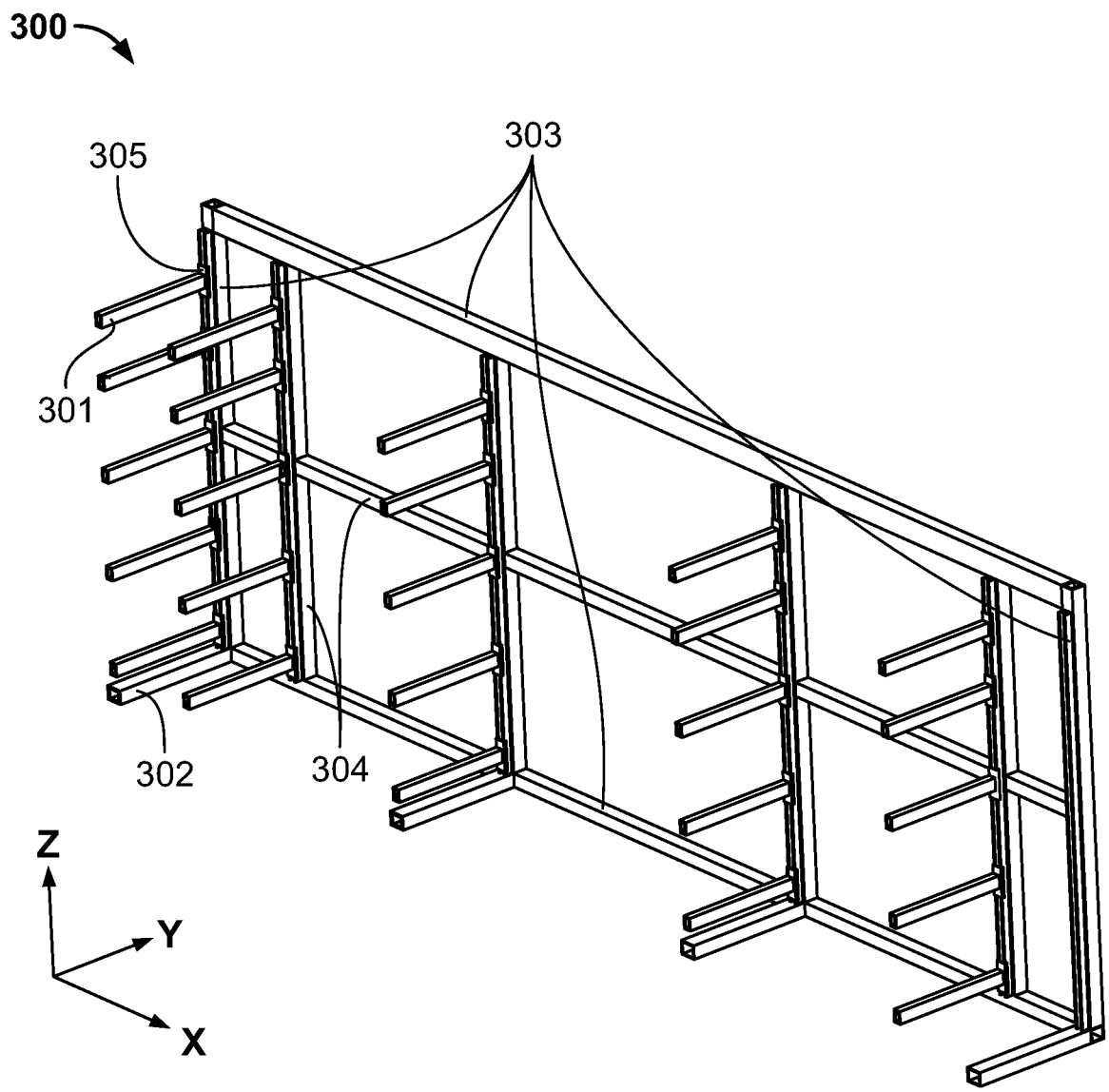
FIG. 3 is an isometric view of a distribution frame in a base condition in accordance with aspects of the disclosure.
Figure 4:
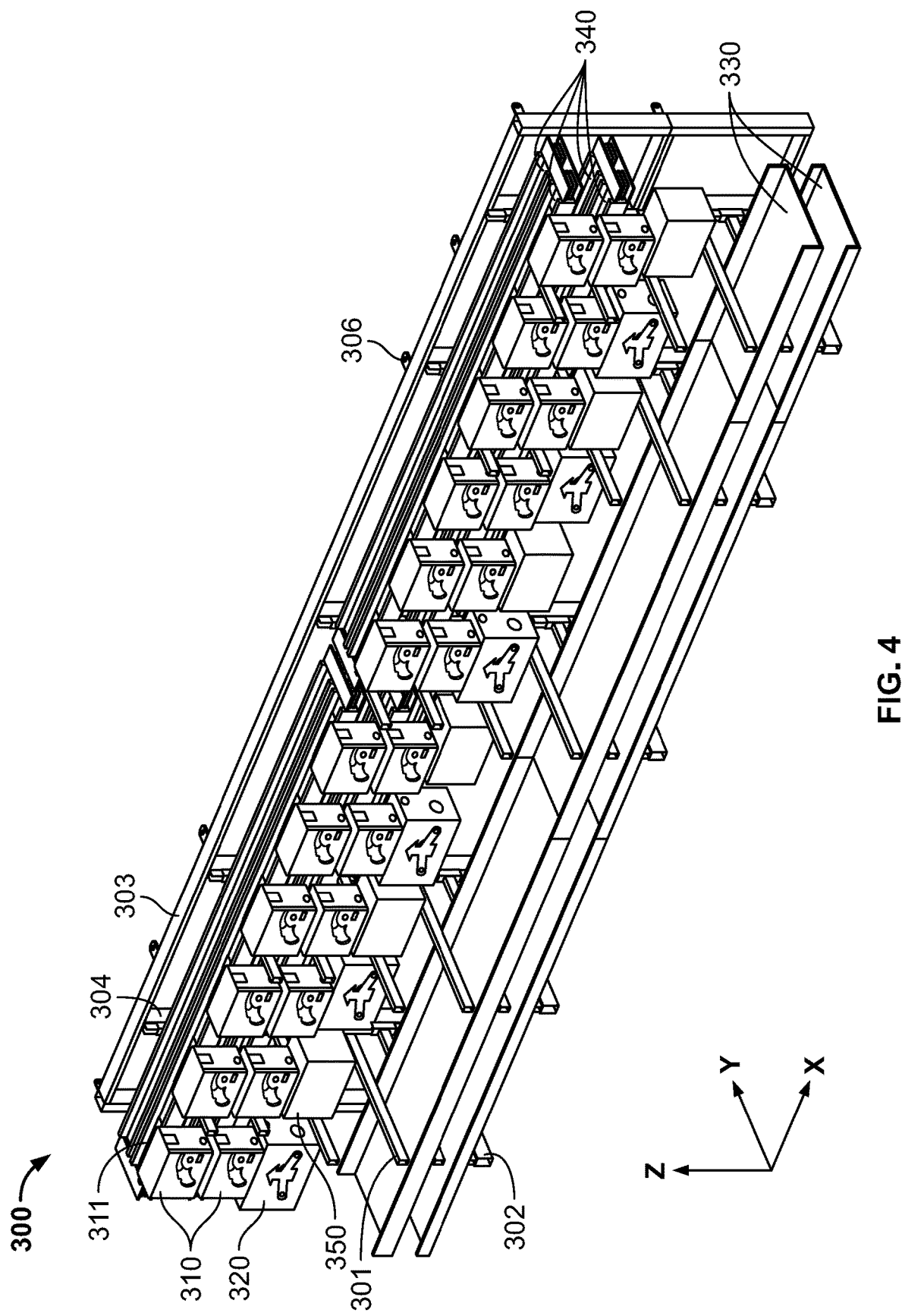
FIG. 4 is an isometric view of a distribution frame in an assembled condition in accordance with aspects of the disclosure.

FIGS. 3-4 depict distribution frame 300 in a base, unassembled condition and an assembled condition. FIG. 3 depicts distribution frame 300 in a base condition, prior to having any accessories installed, such as bus plugs 310, transfer switches 320, cable trays 330, bus ducts 340, and distribution unit 350 while FIG. 4 depicts the distribution frame in an assembled condition including such accessories. In this manner, the accessories can be installed onto distribution frame 300 prior to shipment of assembly 1000 so that the electrical distribution of the various accessories can be assembled and tested under a controlled environment prior to shipment to the prospective data center for assembly.

Distribution frame 300 has a substantially rectangular frame and a number of openings along each face of the frame as defined by main struts 303. Orthogonal struts 304 can provide support to distribution frame 300. Orthogonal struts 304 are connected along a length of main struts 303 and extend substantially along an X- or Z-direction. In another example, there may be diagonal struts extending from a corner defined between a pair of orthogonal struts 304 and/or main struts 303 along a direction toward an opposite corner defined by an opposite pair of orthogonal struts and/or main struts.

Struts 303, 304 may be substantially rectangular and hollow. In this manner, struts 303, 304 can provide structural support to distribution frame 300 while minimizing the weight of the cooling frame. In another example, struts 303, 304 can be cylindrical, triangular, or any other geometric shape. In yet another example, struts 303, 304 are not hollow.

Distribution frame 300 includes plate 306 extending from the distribution frame along the Y-direction. Plate 306 can be configured to engage with a face of cooling frame 200, such as the faces of the cooling frame facing the Y-direction. As such, distribution frame 300 can be secured to cooling frame 200 through plate 306 being fastened, riveted, screwed, or the like. Plate 306 enables distribution frame 300 to be modularized as the distribution frame can be disengaged from assembly 1000 by disengaging plate 306 from cooling frame 200 without affecting other components of assembly 1000 such as the cooling frame, other distribution frames, server racks 400, or supports 500.

Transverse struts 302 extend along a Y-direction from main struts 303, orthogonal struts 304. Transverse struts 302 may be similar in structure to struts 303, 304. Arms 301 extends along a Y-direction from a base plate 305 secured to main struts 303 and orthogonal struts 304. Base plate 305 can be secured to struts 303, 304 through fasteners, rivets, welding, or the like. In another example, arms 301 and transverse struts 302 can additionally or alternatively extend along any direction, such as an X- or Z-direction. In a further example, there may be no transverse struts 302. In other examples, there can be any number of arms 301 and the arms can have any amount of spacing apart from each other.

Arms 301 and transverse struts 302 can provide support for adjacent accessories. In other examples, the arrangement of arms 301 and transverse struts 302 can be changed to accommodate for the type and size of various accessories. For instance, turning to FIG. 4, distribution frame 300 is depicted in an assembled condition including bus plugs 310, transfer switches 320, cable trays 330, bus ducts 340, and distribution unit 350. Bus plugs 310 can provide power to various components of assembly 1000, such as server racks 400. Transfer switch 320 can switch between different sets of bus pugs 310. Cable trays 330 can house the cables that connect to various parts of assembly 1000, such as the cables connected to bus plugs 310. Bus ducts 340 can transfer power generated to bus plugs 310. Distribution units 350 can receive an end of a number of cords or cables such that the position of the cords or cables can be better maintained, and the cords or cables can be more easily accessible.

Each row of bus ducts 340 is supported by a corresponding row of arms 301. For example, where assembly 1000 includes two rows of bus ducts 340 vertically separated from each other, a first top row of bus ducts can be supported by a first top row of arms 301 and a second bottom row of bus ducts can be supported by a second bottom row of arms beneath the top row of arms along the Z-direction. This configuration efficiently uses the available space of the data center as the accessories less likely to be interacted with, such as bus ducts 340, can be placed in a higher, less accessible area while accessories more likely to be interacted with, such as cable trays 330, can be placed in a lower, more accessible area. Bus ducts 340 can be secured to its supporting arms 301 by one of fasteners, rivets, welding, or the like.

Each row of bus plugs 310 is secured to a corresponding row of bus ducts 340 through bus lips 311 extending along a Y-direction toward the bus ducts. In this manner, arms 301 can indirectly provide support to bus plugs 310 through bus ducts 340. Bus lips 311 can provide direct engagement between bus plugs 310 and bus ducts 340 such that the bus ducts can provide power directly to the bus plugs to be passed along to other components of the data center and assembly 1000. Bus lips 311 can be secured to bus ducts 340 through fasteners, rivets, welding, or the like. Bus plugs 310 can be configured to provide electrical power to various electronic components of assembly 1000, such as server racks 400. Bus ducts 340 can be made of a conductive metal such as copper, aluminum, or any other metal capable of conducting electricity from bus plugs 310.

There are multiple rows of bus plugs 310 and bus ducts 340 to account for any potential loss in power. As a loss of power can have detrimental effects on the performance of a data center, multiple sets of bus plugs 310 and bus ducts 340 can enable a constant stream of power to the data center such as, when one set of bus plugs fails, another can start working in its place. Transfer switches 320 can allow for such a switch between one set of bus plugs 310 to another. For instance, where a top row of bus plugs 310 fails, transfer switch 320 can be activated to switch to a bottom row of bus plugs 310. As such, transfers switches 320 are secured directly beneath bus plugs 310 to minimize lag time between switch bus plugs, as well as to reduce the length of cable between the transfer switches and bus plugs. Transfer switch 320 can be secured to distribution frame 300 through fasteners, rivets, welding, screws, or the like.

Distribution units 350 are secured to at least one of arms 301 or orthogonal struts 304 through fasteners, rivets, welding, screws, or the like. Distribution units 350 can receive an end of cord or cables of adjacent accessories, such as bus plugs 310 and transfer switch 320. In this manner, the cord or cables of the adjacent accessories can be more easily accessible when certain operations are required to be performed on those accessories, such as replacements or the like.

Cable trays 330 are supported along lower rows of arms 301 and transverse struts 302. Cable trays 330 can be secured to arms 301 and transverse struts 302 through fasteners, rivets, welding, or the like. Cable trays 330 can be configured to carry cables and other connecting accessories required to operate the accessories, such as for bus plugs 310, transfer switches 320, and distribution units 350. As such, cable trays 330 are placed below the other accessories along the Z-direction to house the cables extending from their corresponding accessories.

However, in other examples, the accessories may have other arrangements. For instance, distribution units 350 can be secured to distribution frame 300 between a first row of bus plugs and a second row of bus plugs to provide optimal placement of the cords or cables for both rows of bus plugs 310. In another example, there may be no distribution unit 350.

Figure 5:
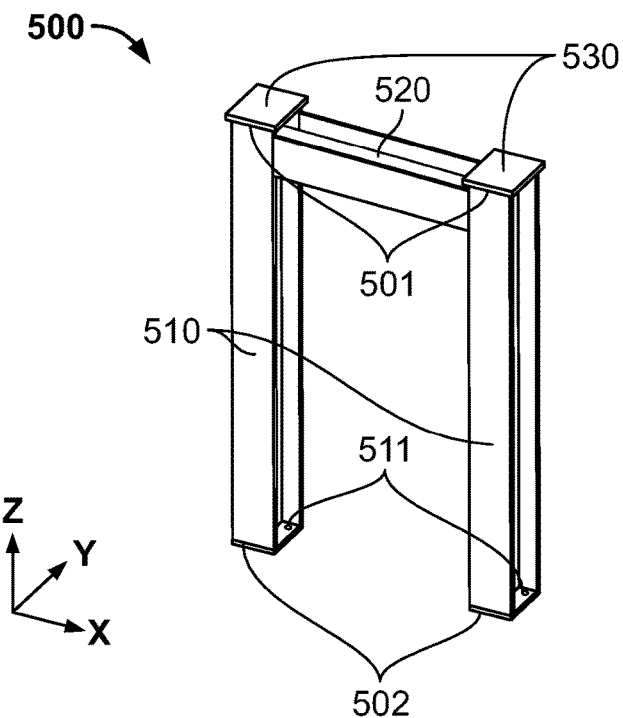
FIG. 5 is an isometric view of a support in accordance with aspects of the disclosure.

FIG. 5 depicts support 500 having two columns 510 with top end 501 and bottom end 502, and a connecting column 520. Columns 510 are secured to each other through a connecting column 520 adjacent top end 501 of each column 510. Columns 510, 520 are monolithic structures that include two opposing faces, and an interior strut substantially orthogonal to each of the two opposing faces and extending along a central portion between each of the two opposing faces. In other examples, columns 510, 520 may have any other shape, such as being rectangular, cylindrical, or any other geometric shape. Further, columns 510, 520 may be hollow.

Bottom end 502 of columns 510 may include at least one hole 511 to receive a screw, fastener, or rivet to secure support 500 to the floor. Bottom end 502 of columns 510 may include any number of holes 511, such as one, two, three, or any other number.

Support 500 includes plates 530 secured to top end 501 of each of columns 510. Plates 530 are substantially rectangular but, in other examples, can have any other shape, such as circular, triangular, or the like. Plates 530 can be secured to columns 510 through fasteners, rivets, screws, or the like. The configuration of columns 510, 520 can provide stability for loads placed on plates 530, such as cooling frame 200 and distribution frames 300. In other examples, plates 530 can have a number of holes (not shown) to receive a fastener, rivet, screw, or the like to engage a structure, such as cooling frame 200, placed on top of the plates.

Figure 6:
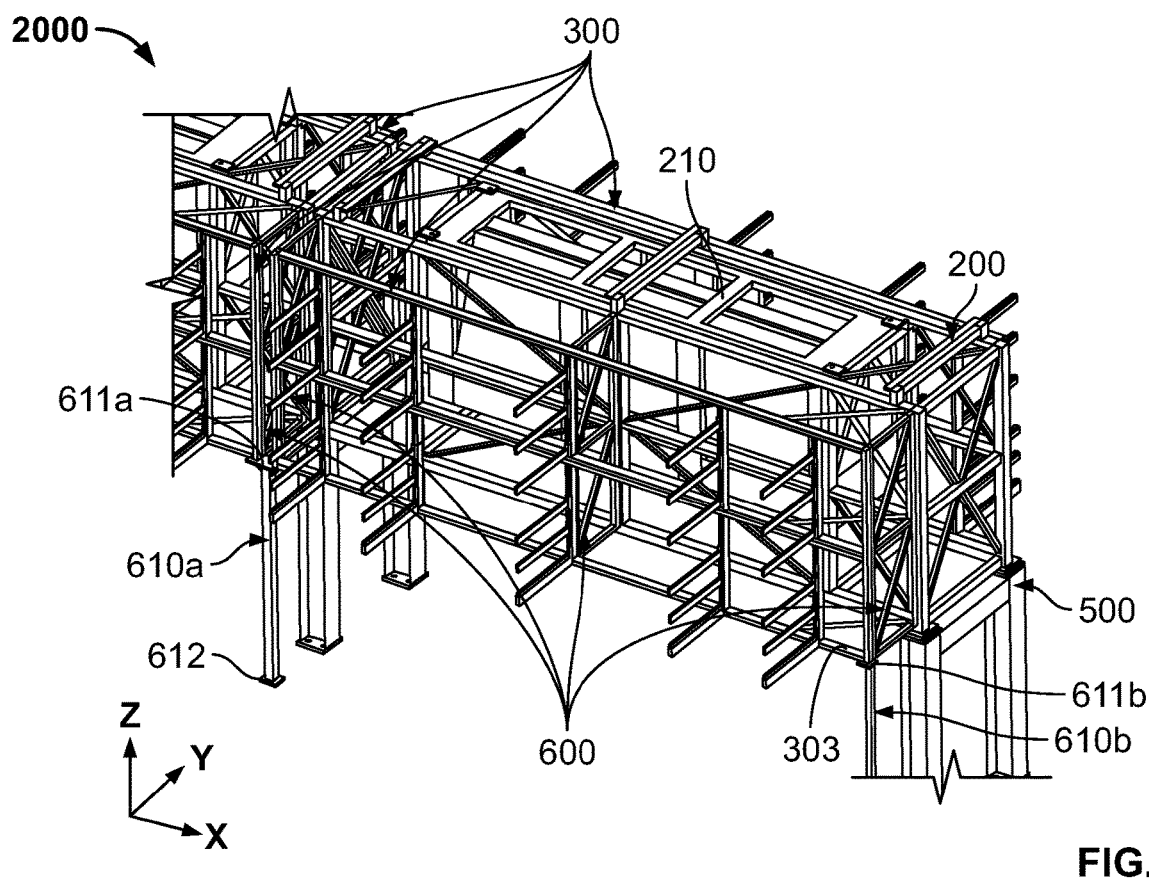
FIG. 6 is an isometric view of an assembly in accordance with aspects of the disclosure.

FIGS. 6-7 depict another example assembly 2000 including cooling frame 200 and cooling unit 210, distribution frames 300, and support 500 as described above. Assembly 2000 includes extension frames (or modules) 600 secured between cooling frame 200 and one of distribution frame 300. Extension frames 600 have a substantially rectangular shape defined by main struts 601 and include a number of intervening struts 602. Intervening struts 602 can be a number of diagonal struts or orthogonal struts secured along a portion of main struts 601. Intervening struts 602 can provide stability and support to extension frame 600. Extension frame 600 can have a height extending along the Z-direction similar height to distribution frame 300, however, in other examples, the extension frame may be taller or shorter. Extension frame 600 is secured between distribution frame 300 and cooling frame 200 such that a top end of the extension frame is aligned with a top end of the distribution frame and the cooling frame. In other examples, extension frame 600 may be secured between distribution frame 300 and cooling frame 200 along any portion of the distribution frame or cooling frame. Extension frame 600 can be secured to distribution frame 300 and cooling frame 200 through one of a fastener, rivet, screw, or the like.

Extension frame 600 can have a width extending along the Y-direction sufficient to provide a distance between distribution frame 300 and cooling frame 200 to define a space for objects to be received within assembly 2000, such as a building column (not shown) of the data center site. In this manner, where assembly 2000 is planned to be assembled in a data center location having building columns that may interfere with the positioning of the assembly, extension frame 600 can be installed to provide a space for the building column without interfering with the performance of the assembly or affecting the efficiency of the data center to be constructed.

Assembly 2000 also includes supports 610*a,b* having plates 611*a,b* along a top end and bottom end 612. Supports 610*a,b* provide additional support to the distribution frame 300 that is secured to extension frames 600. Supports 610*a,b* includes a plate 611*a,b* at a top end and a plate 612 at a bottom end. Plates 611*a,b* at the top end of supports 610 is secured to a bottom end of main strut 303 of distribution frame 300. Through this engagement, plates 611*a,b* can provide load-bearing support to distribution frame 300. Plate 611*a,b* is substantially rectangular however, in other examples, the plate may have any other shape such as circular, triangular, or any other geometry.

Plate 611*a,b* has a surface area sufficient to support at least one end of a distribution frame 300 however, in other examples, the plate can also have a surface area sufficient to support two ends of a distribution frame. For instance, plate 611*b* has a surface area is sufficiently large to support an end of a single distribution frame 300. However, plate 611*a* has a surface area sufficiently large to support two adjacent distribution frames 300, such as where there are two assemblies 2000 adjacent each other. In other examples, plate 611*a,b* can have a surface area sufficiently large to support more than two ends of a distribution frame 300. In further examples, supports 610*a,b* may be secured along any portion of distribution frame 300, such as along a central portion of main strut 303 of the distribution frame. Further, there may be any number of supports 610*a,b*, such as one, three, four, or the like.

In other examples, there may be any number of extension frames 600 secured to distribution frame 300 and cooling frame 200, such as four, five, six, or the like. In a yet further example, extension frames 600 may be secured along any face of cooling frame 200, such as the faces of the cooling frame facing along the X-direction. In this manner, assembly 2000 can be constructed to take into account various structures in a potential data center site. In another example, there may be no support 610 engaged with distribution frame 300.

FIG. 8 depicts another example assembly 3000 including cooling frame 200 housing cooling unit 210 and distribution frames 300 as described above. Extension frames 600 is similar to the extension frames described above in FIGS. 6-7, such as the width of the extension frames extending along the Y-direction, except the height of the extension frames of assembly 3000 extend along an X-direction. Moreover, extension frames 600 are secured between cooling frame 200 and distribution frame 300 along a top end, central portion, and bottom end of the cooling frame and distribution frame. Assembly 3000 includes diagonal struts 620 adjacent a top end and a bottom end of cooling frame 200 and distribution frame 300. Diagonal struts 620 extends from cooling frame 200 along a direction in the Y-Z plane towards distribution frame 300. Diagonal struts 620 can provide additional support to distribution frame 300.

Figure 9:
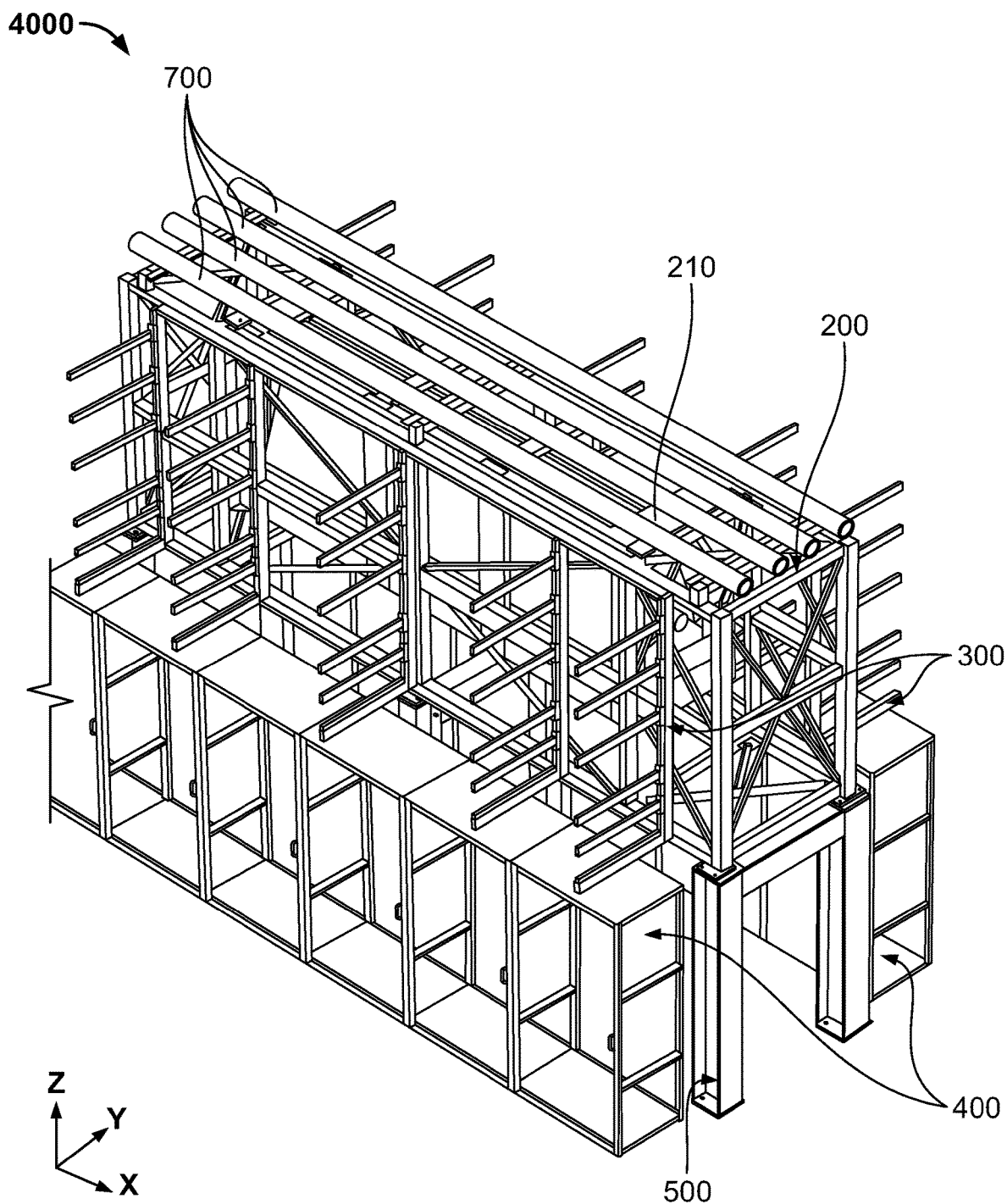
FIG. 9 is an isometric view of an assembly in accordance with aspects of the disclosure.

FIG. 9 depicts another example assembly 3000 including cooling frame 200 and cooling unit 210, distribution frames 300, server racks 400, and support 500 as described above. Assembly 3000 further includes a number of pipes 700. Pipes 700 are secured to a top portion of cooling frame 200 having a length extending along the X-direction and in line with the length of the cooling frame. Pipes 700 can be secured to cooling frame 200 through rivets, screws, or the like. Pipes 700 can be configured to communicate with cooling unit 210 to carry a liquid coolant to other portions of assembly 3000 or the data center. In one example, pipes 700 may extend along any direction, including the Y- or Z-directions. In a further example, pipes 700 may have any length, including longer or shorter than cooling frame 200. In a further example, there may be any number of pipes 700, such as two, three, or the like. In other examples, pipes 700 can be secured along any portion of assembly 1000.

Figure 10:
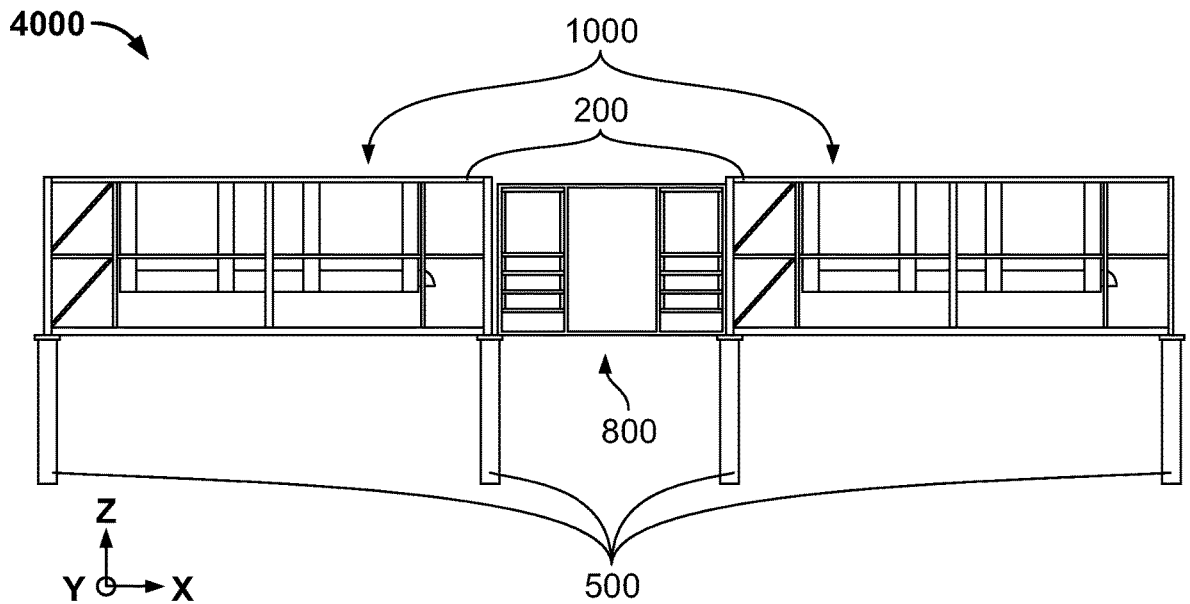
FIG. 10 is a side view of an assembly in accordance with aspects of the disclosure.

FIG. 10 depicts assembly structure 4000 having a transport frame (or module) 800 secured between assemblies 1000 as described above, except distribution frames are not installed on the assemblies. Transport frame 800 is secured between faces of cooling frame 200 of assembly 1000 facing along an X-direction. Each end of transport frame 800 is secured to a support 500 through fasteners, rivets, screws, or the like. Transport frame 800 can carry certain accessories, such as cable trays, that may be used to replace other accessories of assembly structure 4000.

Figure 11:
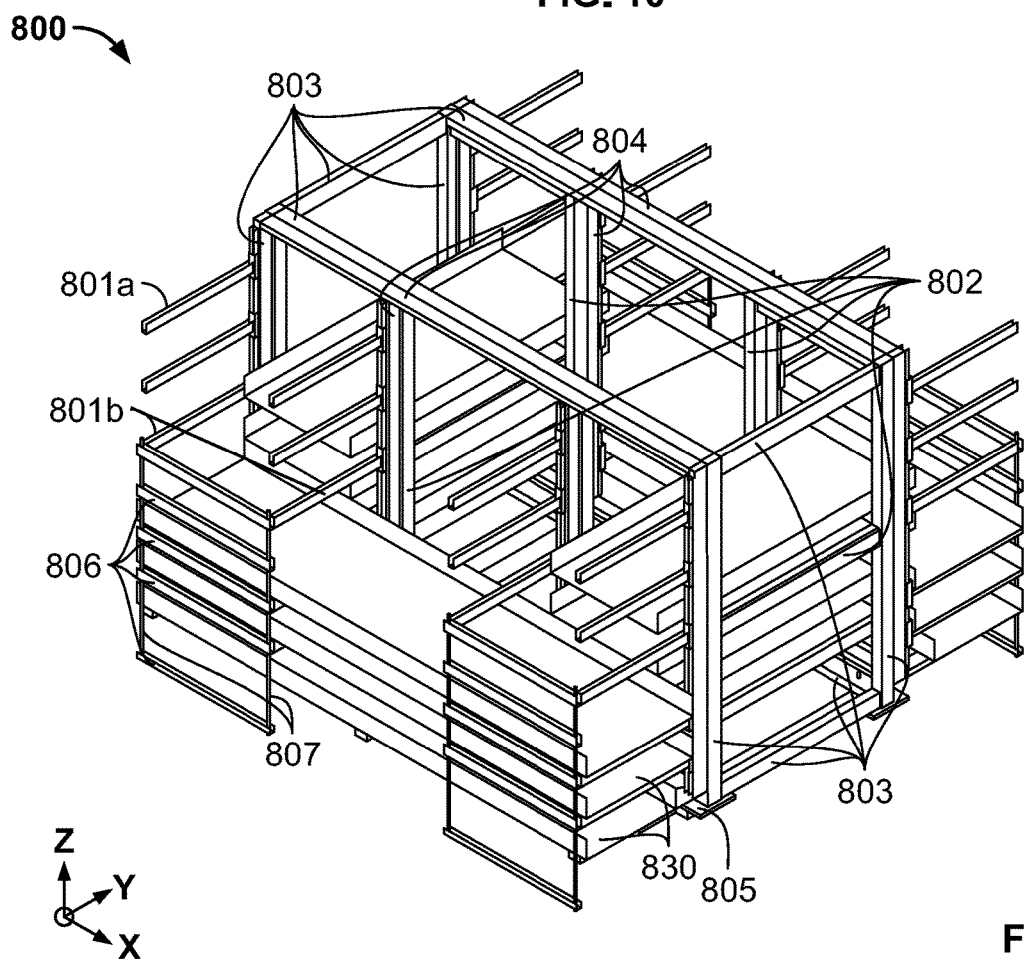
FIG. 11 is an isometric view of the assembly of FIG. 10.

FIG. 11 depicts transport frame 800 having main struts 803 and intervening struts 802. Main struts 803 defines the substantially rectangular shape of transport frame 800. In other examples main struts 803 can define transport frame 800 to have any shape, such as cylindrical, pyramidal, or the like. Intervening struts 802 are secured along a portion of main struts 803 and orthogonally extend from those main struts. In other examples, intervening struts 802 can extend from main struts 803 at any angle, such as in a diagonal and non-orthogonal fashion from the main struts.

Transport frame 800 includes side struts 801 extending along a Z- or X-direction. Side struts 804 can provide additional support to transport frame 800. Struts 802, 803, 804 can have a similar structure and shape as struts 203, 204, 205 as described above for cooling frame 200 in FIG. 2. Further, transport frame 800 includes plates 805 secured to a bottom end of main struts 802 similar to plates 201 as described above for cooling frame 200 in FIG. 2.

Arms 801*a,b* can have a similar structure and shape as arms 301 of distribution frame 300 in FIGS. 3-4. Arms 801*a* are free from any connecting structure however arms 801*b* includes cross connectors 806. A first cross connector 806 can engage free ends of arms 801*b* along the X-direction. Elongate portion 807 extends along a Z-direction from ends of the first cross connector 806 engaged to arms 801*b*. Other cross connectors 806 that are not engaged to the arms 801*b* are secured in place along a length of elongate portions 807. Cross connectors 806 can have a similar structure as arms

801a,b however, in other examples, the cross connectors can have a cylindrical shape, pyramidal shape, or the like. Arms 801a,b and cross connectors 806 can facilitate storage of accessories, such as cable trays 830. Cable trays 830 are similar to cable trays 330 described above for distribution frames 300 in FIGS. 3-4.

Any portion of the assemblies or assembly constructions may be constructed in whole or in part, from one or more metals including, titanium and its alloys, stainless steel and its alloys, magnesium and its alloys, cobalt and its alloys, nickel and its alloys, silver, tantalum, or any other kinds of metals. Any portion of the assemblies may also be made from one or more polymers such as any one or combination of polyethylene (PE), high-density polyethylene (HDPE), polyvinyl chloride (PVC), silicone, cross-linked polymers, or any other polymers.

Any portion of the assemblies can be pre-fabricated from a monolithic workpiece, such as using a computer numerical control (CNC) machine, three-dimensional printing, or the like. For instance, cooling frame, distribution frame, server racks, supports, extension frame, and transport frame can be pre-fabricated from a monolithic workpiece.

Any portion of the assemblies or assembly constructions may be packaged together as a kit ready for installation. For instance, with reference to FIGS. 1-5, a kit for assembly 1000 may include server racks 400, supports 500, distribution frames 300, and cooling frame 200. Cooling frame 200 may include cooling unit 210 already installed on the cooling frame, as depicted in FIG. 2. However, in other examples, cooling frame 200 may be a part of the kit without cooling unit 210 installed.

Distribution frames 300 may be included in the kit in a base condition or assembled condition. For example, distribution frames 300 may be included in the kit in an assembled condition including at least one accessory installed on the distribution frame, such as bus plugs 310, transfer switches 320, bus ducts 330, cable trays 340, and distribution units 350 as depicted in FIG. 4. In another example, distribution frame 300 can be included in a base condition without any accessories, as depicted in FIG. 3.

The kit may further include a number of other components. With reference to FIGS. 6-8, the kit may include extension frames 600 and diagonal struts 620. With reference to FIG. 9, the kit may include pipes 700. Pipes 700 may come installed on cooling frame 200, or may be separate from the cooling frame and installed on-site. With reference to FIGS. 10-11, the kit may include transport frame 800. Transport frame 800 may already have side struts 804, cross connectors 806, and elongate portions 807 installed, however, in other examples, such components are installed on-site. Further, cable trays 830 may already be stored within transport frame 800 in the kit, however, in other examples, the cable trays may be stored within the transport frame on-site.

Figure 12:
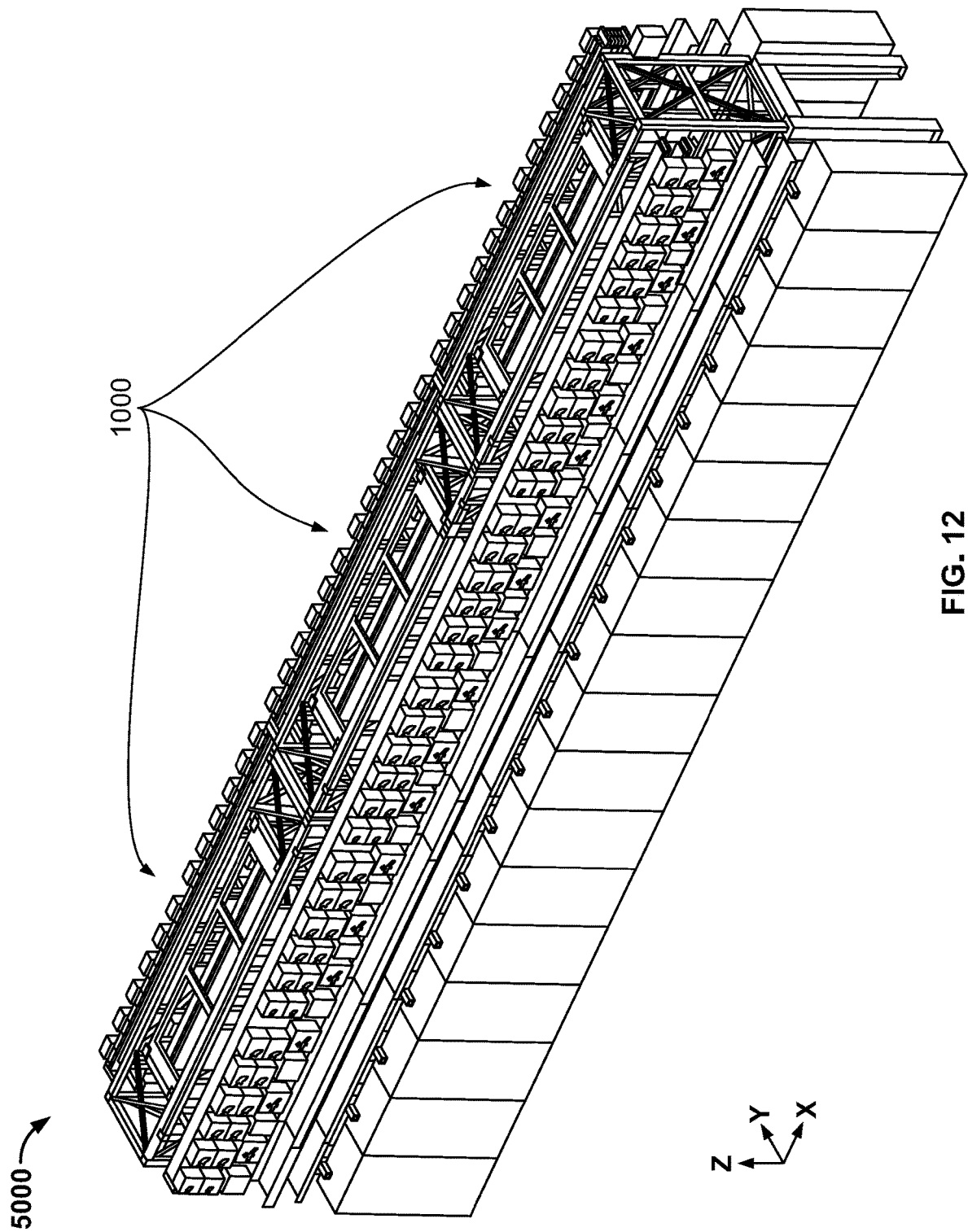
FIG. 12 is an isometric view of a server line in accordance with aspects of the disclosure.
Figure 13:
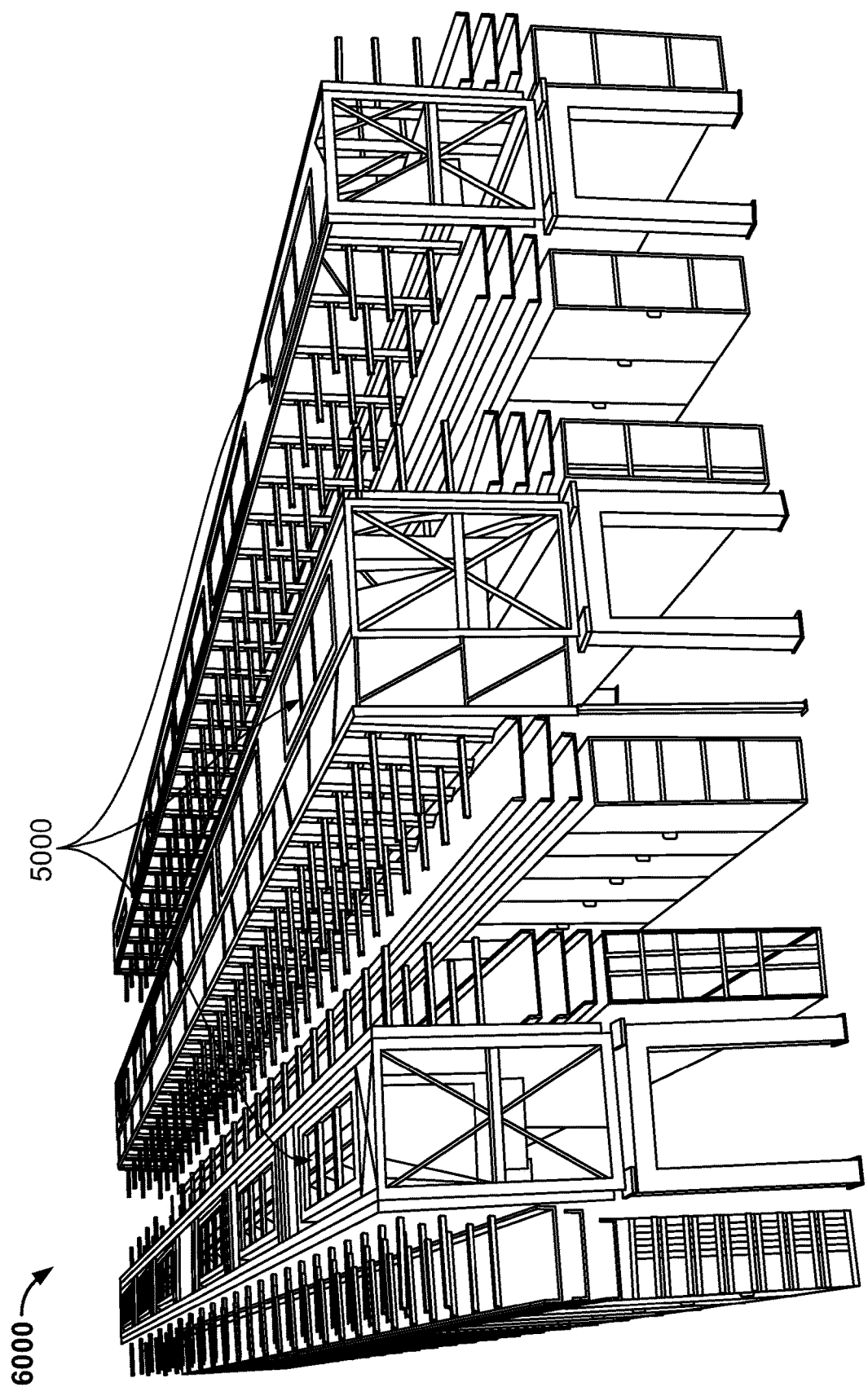
FIG. 13 is an isometric view of server rows in accordance with aspects of the disclosure.
Figure 14:
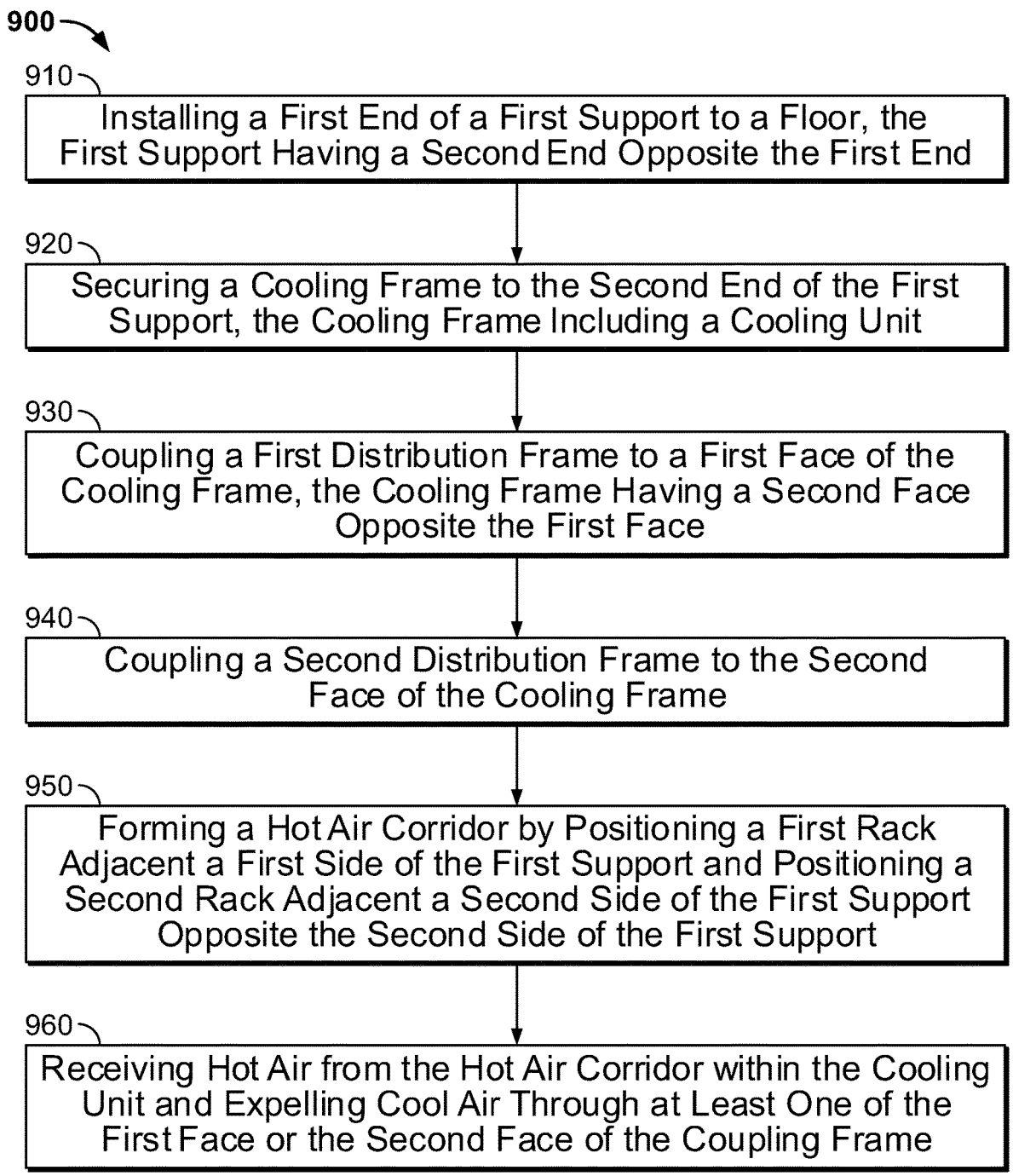
FIG. 14 depicts an example flowchart of the method of constructing and operating an assembly in accordance with aspects of the disclosure.

The assemblies described above can be secured to the floor adjacent each other such that multiple assemblies formed together can form a server line. FIG. 12 depicts a server line 5000 having a number of assemblies 1000 as described above. Assemblies 1000 are lined up adjacent each other along an X-direction to form server line 5000. In other examples, server line 5000 can have more or less than three assemblies 1000 forming a server line 5000, such as two, four, five, or the like. Moreover, a number of server lines can be secured adjacent each other to form a server array. FIG. 13 depicts server array 6000 with a number of server lines 5000 secured to the floor adjacent each other and extending along the X-direction. In other examples, server array 6000 can have more or less than three server lines 5000, such as two, four, five, or the like.

With reference to FIGS. 1-5 and 14, a method of constructing assembly 1000 will now be described. Although the below steps are described in a sequential order, it should be understood that the steps of the method may be performed in any order. A kit as described above may first be shipped out to a location for constructing a new data center. Once the kit has been received, each part of the kit may be used to construct assembly 1000. Certain parts of the kit may first be prepared prior to installation of assembly 1000. For instance, where cooling unit 210 was not installed within cooling frame 200 when the kit was shipped, the cooling unit can be installed to the cooling frame prior to assembling assembly 1000. Similarly, the accessories bus plugs 310, transfer switches 320, cable trays 330, bus ducts 340, and distribution units 350 may be installed on distribution frames 300. In other examples, the accessories may be installed after distribution frame 300 has been installed on assembly 1000, as discussed below.

With reference to block 910, a bottom end 502 of first support 500 may be installed to the floor. A second support 500 can then be installed a distance away from first support 500 to define a length of assembly 1000 along the X-direction.

With reference to block 920, a bottom end of cooling frame 200 is secured to supports 500 through plates 201 being fastened, screwed, riveted, or the like to the supports. Where cooling unit 210 is not already secured within cooling frame 200, the cooling unit may be secured to the cooling frame through being fastened, screwed or riveted to plates 202.

With reference to block 930, a first distribution frame 300 is secured to a first face of cooling frame 200 that faces along the Y-direction through plates 306 through fasteners, rivets, screws, or the like. A second distribution frame 300 can then similarly be secured to a second face of cooling frame 200 that faces along the Y-direction opposite the first face of the cooling frame. Where distribution frames 300 do not already include accessories installed on the distribution frame, such accessories can be installed once the distribution frame is secured onto cooling frame 200. For instance, bus ducts 340 may be secured to, and supported by, arms 301. Bus plugs 310 may then be secured to bus ducts 340 by engaging bus lips 311 to the bus ducts such that the bus plugs face along the Y-direction. Transfer switches 320 and distribution units 350 may be secured to distribution frame 300 through fasteners, rivets, screws, or the like. Cable trays 330 may be secured onto, and supported by, arms 301.

With specific reference to FIGS. 6-8, where the kit included extension frames 600, diagonal struts 620, and supports 610a,b, the extension frames may be installed to cooling frame 200 prior to distribution frames 300 being installed. For instance, extensions 600 may be secured to a face of cooling frame 200 facing along the Y-direction through fasteners, rivets, screws, or the like. Extension frames 600 may be secured to cooling frame 200 along main struts 601 such that a length of the extension frames extend along a Z- or X-direction while a width of the extension frame extends along a Y-direction. Diagonal struts 620 may additionally be installed along a portion of cooling frame 200. Supports 610a,b may be secured to the floor along bottom end 612 in a position configured to support a distribution frame 300. At least one distribution frame 300 can then be secured to an end of extensions 600 along main struts 601. A bottom end of distribution frame 300 can be secured to a plate 611a,b of support 600.

With specific reference to FIG. 9, where the kit includes pipes 700, the pipes may be secured to a top face of cooling frame 200 to extend long an X-direction. In other examples, pipes 700 may be secured to cooling frame 200 to extend along any direction, such as a Y-direction.

With specific reference to FIGS. 10-11, where transport frame 800 is included within the kit, a plate 805 of the transport frame may be secured to supports 200 such that a face of the transport frame facing along the X-direction may be secured adjacent to a face of cooling frame 200 facing along the X-direction. Where transport frame 800 does not already have side struts 804, cross connectors 806, and elongate portions 807 installed, such components may be installed prior to securing the transport frame to supports 200. For instance, side struts 804 may be secured to a face of transport frame 800 facing along the Y-direction. Ends of cross connectors 806 can be secured to ends of arms 801b. Elongate portion 807 can be inserted within ends of cross connectors 806 to extend along a Z-direction and secure the other cross connectors. Cable trays 830 may be stored within transport frame 800 to be supported by at least one of arms 801a,b and cross connectors 806.

With reference to block 940, a first and second server racks 400 may be placed on either side of supports 500, underneath distribution frames 300, along the Y-direction to define hot air corridor 410.

Once assembly 1000 has been assembled, in operation, the hot air from the electrical components within the server racks 400 can be directed to hot air corridor 410 defined between the server racks. The hot air will rise through cooling frame 200 along the Z-direction and be received in cooling unit 210. Cooling unit 210 can generate a cool medium, such as air or liquid, using processes known in the art. For instance, where the cool medium is cool air, the cool air can be expelled along the Y-direction through cooling frame 200. The cool air will fall down along the Z-direction through distribution frame 300 and onto server racks 400 to cool the server racks. In another example, cooling unit 210 can generate cool liquid to be piped along assembly 1000 to cool down the assembly, such as through pipes 700.

With specific reference to FIGS. 12-13, multiple assemblies 1000 can be positioned adjacent each other along an X-direction to form a server line 5000. Such server lines 5000 can then be positioned adjacent each other along a Y-direction to form server array 6000.

Modularization and standardization of data center components allows for greater efficiency in both construction and maintenance of data centers. Having a set of modular and standardized components can minimize the amount of time required to plan for data center construction and to actually construct the data center. Moreover, modularization enables such components to be easily replaced without affecting other components of the data center. In this manner, there can be decreased down time for data centers during maintenance. Moreover, maintenance costs can be decreased, such as when modular data center components need to be replaced, as less equipment is needed to replace these components since the component can be replaced without affecting other components.

However, current practices of constructing data centers are not fully modularized in the same manner as the assemblies of this disclosure. Modern data centers involve many floor-to-roof components, preventing full modularization without detrimentally affecting thermal zone management and server performance. During maintenance under current practices, to replace or repair a certain component of the data center, large portions of data centers unrelated to that component must be engaged and disengaged in order. Moreover, even where certain components of data centers under current practices are modularized, it can be difficult to arrange such components in a manner that allows for an efficient operation of a data center, given the confines of data center sites, without further customizing such components and negating the benefits of having a set of standardized, modular data center components.

The assemblies of this disclosure are an improvement on current practices of constructing data centers by further modularizing data center components. As the assemblies of this disclosure are not floor-to-roof structures, each component may be directed to a certain function such that each component can be easily replaced without inconveniencing other components of the data center. For instance, a distribution frame can be directed to housing bus plugs that provide power to the data center while a cooling frame can include a cooling unit directed to cooling the server racks. As such, the distribution frame is a modular component separate from the cooling frame, thus allowing for the distribution frame to be disengaged from the assembly without affecting the performance of the cooling frame.

Moreover, the increased modularity of the assemblies of this disclosure enable the assemblies to be constructed in a variety of potential data center layouts without affecting the performance of the data center, or taking into account the roof structure and height of each layout. Each assembly can be a discrete unit that is capable of optimally and efficiently housing and powering servers such that a formation of multiple assemblies can be quickly planned out and assembled over a wide variety of data center layouts with little to no changes to the standard structure of an assembly. As the construction of each assembly of the disclosure enables each assembly to maintain an efficient operation, there is less need to customize components of the assembly to conform to a given data center layout in order to achieve a desired efficiency. This decreased need for customization allows for a standardization in data center components that contribute to both decreased complexity in planning and decreased resources required to construct the data center.

Further, the modularized assembly allows for better quality and consistency in the construction of server assemblies. In current practices of constructing data centers, the efficiency of each assembly team at each construction site may vary depending on the experience and skill of each team. The modularized assembly of the disclosure allows for a consistent and stable assembly team that manufactures each component of the modularized assembly prior to shipping the kit to each construction site. In this manner, each component's quality can be ensured to be at a minimum standard prior to shipping them to the data center construction site. Moreover, having a consistent assembly team can assist in lowering labor costs as improvements in the efficiency of the assembly team in manufacturing each component of the modularized assembly kit leads to a uniform improvement in efficiency in all constructions of the modularized assembly rather than just an improvement in efficiency at a specific job site.

Although the subject matter herein has been described with reference to particular examples, it is to be understood that these examples are merely illustrative of the principles and applications of the subject matter described. It is therefore to be understood that numerous modifications may be made and that other arrangements may be devised without departing from the spirit and scope as defined by the appended claims.

The invention claimed is:

1. A kit comprising:
   a first support having a first end and a second end opposite the first end, the first support configured to be secured to a floor at the first end;
   a cooling frame having a cooling unit received therein, the cooling frame having a first face and a second face opposite the first face, the cooling frame configured to be secured to the second end of the first support, and the cooling unit being configured to expel a coolant from the first face and the second face;
   a first distribution frame having a first plurality of support arms extending therefrom, the first distribution frame configured to be coupled to the first face of the cooling frame; and
   a second distribution frame having a second plurality of support arms extending therefrom, the second distribution frame configured to be coupled to the second face of the cooling frame.

2. The kit of claim 1, wherein the first distribution frame includes a first bus plug and the second distribution frame includes a second bus plug.

3. The kit of claim 1, further comprising a transport frame, the cooling frame having a third face transverse to the first face and the second face, the transport frame configured to be secured to the third face of the cooling frame.

4. The kit of claim 1, further comprising an extension frame having a first end and a second end opposite the first end, the first end of the extension frame configured to be secured to the first face of the cooling frame and the second end of the extension frame configured to be secured to the first distribution frame.

5. The kit of claim 3, further comprising a support leg configured to support a first end of the first distribution frame.

6. The kit of claim 1, wherein the coolant is cold air.

7. The kit of claim 1, wherein the cooling unit expels the coolant from the first face and the second face and the coolant falls through the distribution frames onto objects arranged under the first and second distribution frames.

8. A kit for using a data center comprising:
   a cooling module having a cooling unit received therein, the cooling module having a first face and a second face opposite the first face;
   a first distribution module having a first plurality of support arms extending therefrom, the first plurality of support arms supporting a first bus duct, the first distribution module configured to be coupled to the first face of the cooling module;
   a second distribution module having a second plurality of support arms extending therefrom, the second plurality of support arms supporting a second bus duct, the second distribution module configured to be coupled to the second face of the cooling module; and
   an extension frame having a first end and a second end opposite the first end, the first end of the extension frame configured to be secured to the first face of the cooling module and the second end of the extension frame configured to be secured to the first distribution module.

9. The kit of claim 8, wherein the first distribution module includes a first bus plug and a first transfer switch, and the second distribution module includes a second bus plug and a second transfer switch.

10. The kit of claim 8, further comprising a support leg configured to support a first end of the first distribution module.

11. The kit of claim 8, further comprising a transport frame, the cooling module having a third face transverse to the first face and the second face, the transport frame configured to be secured to the third face of the cooling module.

12. A data center system comprising:
    a first rack and a second rack defining a hot air corridor therebetween;
    a first support having a first end and a second end opposite the first end, the first end of the first support secured to a floor within the hot air corridor;
    a cooling frame secured to the second end of the first support, the cooling frame having a first face and a second face opposite the first face;
    a cooling unit secured within the cooling frame, the cooling unit configured to receive hot air from the hot air corridor and expel a coolant from the first face and the second face;
    a first distribution frame coupled to the first face of the cooling frame; and
    a second distribution frame coupled to the second face of the cooling frame.

13. The data center system of claim 12, wherein:
    the first distribution frame includes a first bus plug and a first transfer switch, and the second distribution frame includes a second bus plug and a second transfer switch;
    the first distribution frame includes a first plurality of support arms supporting a first bus duct; and
    the second distribution frame includes a second plurality of support arms supporting a second bus duct.

14. The data center system of claim 13, wherein:
    the first distribution frame includes a third bus plug, the first bus plug having a greater height from the floor than the third bus plug, and the first bus plug and third bus plug having a greater height from the floor than the first transfer switch; and
    the second distribution frame includes a fourth bus plug, the second bus plug having a greater height from the floor than the fourth bus plug, and the second bus plug and the fourth bus plug having a greater height from the floor than the second transfer switch.

15. The data center system of claim 13, wherein:
    the first distribution frame includes a first transport tray supported by the first plurality of arms, the first transport tray having a height from the floor less than the first transfer switch;
    the second distribution frame includes a second transport tray supported by the second plurality of arms, the second transport tray having a height from the floor less than the second transfer switch.

16. The data center system of claim 13, wherein:
    the first rack is positioned between the first plurality of support arms of the first distribution frame and the floor; and
    the second rack is positioned between the second plurality of support arms of the second distribution frame and the floor.

17. The data center system of claim 12, further comprising an extension frame having a first end and a second end opposite the first end, the first end of the extension frame secured to the first face of the cooling frame and the second end of the extension frame secured to the first distribution frame.

18. The data center system of claim 17, further comprising a support leg supporting a first end of the first distribution frame.

19. The data center system of claim 12, further comprising a second support, the first support secured to a first end of the cooling frame and the second support secured to a second end of the cooling frame.

20. The data center system of claim 19, further comprising a transport frame, the cooling frame having a third face transverse to the first face and the second face, the transport frame secured to the third face of the cooling frame.

* * * * *